United States Patent
Choi et al.

(10) Patent No.: US 10,783,033 B2
(45) Date of Patent: Sep. 22, 2020

(54) DEVICE AND METHOD FOR ACCESSING IN-BAND MEMORY USING DATA PROTECTION

(71) Applicant: SAMSUNG ELECTRONICS CO., LTD., Suwon-si, Gyeonggi-do (KR)

(72) Inventors: Hyungwoo Choi, Hwaseong-si (KR); Hyungjoon Park, Hwaseong-si (KR); Jinwoong Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 167 days.

(21) Appl. No.: 15/981,429

(22) Filed: May 16, 2018

(65) Prior Publication Data

US 2019/0129793 A1 May 2, 2019

(30) Foreign Application Priority Data

Oct. 30, 2017 (KR) .......................... 10-2017-0142670

(51) Int. Cl.
*G06F 11/00* (2006.01)
*G06F 11/10* (2006.01)
*G06F 12/0804* (2016.01)
*G11C 29/52* (2006.01)

(52) U.S. Cl.
CPC ...... *G06F 11/1068* (2013.01); *G06F 11/1064* (2013.01); *G06F 12/0804* (2013.01); *G06F 2212/1032* (2013.01); *G06F 2212/403* (2013.01); *G11C 29/52* (2013.01)

(58) Field of Classification Search
CPC ............ G06F 11/1068; G06F 11/1064; G06F 12/0804; G06F 2212/1032; G06F 2212/403; G11C 29/52
See application file for complete search history.

(56) References Cited

U.S. PATENT DOCUMENTS

| | | |
|---|---|---|
| 5,341,487 A | 8/1994 | Derwin et al. |
| 5,572,660 A | 11/1996 | Jones |
| 6,295,582 B1 | 9/2001 | Spencer |
| 6,496,905 B1 | 12/2002 | Yoshinka et al. |
| 6,804,799 B2 | 10/2004 | Zuraski, Jr. |
| 7,697,311 B2 | 4/2010 | Fukuda et al. |
| 8,549,222 B1 | 10/2013 | Kleiman et al. |
| 9,110,809 B2 | 8/2015 | Holmqvist et al. |
| 9,189,329 B1 | 11/2015 | Zhu et al. |

(Continued)

FOREIGN PATENT DOCUMENTS

| KR | 10-2001-0050796 A | 6/2001 |
|---|---|---|
| KR | 10-0884351 B1 | 2/2009 |

*Primary Examiner* — Christine T. Tu
(74) *Attorney, Agent, or Firm* — Volentine, Whitt & Francos, PLLC

(57) ABSTRACT

A computing device includes a main memory, a processor, and a cache. The main memory stores data and parity, for checking an error of the data, and sends and receives the data and parity with a reference size. The processor accesses the main memory, and the cache memory caches the data. If the processor requests a write operation for current data, the current data are stored to the cache memory and the cache memory changes the stored current data to the reference size and outputs the current data changed to the reference size to the main memory. A size of the current data is smaller than the reference size.

18 Claims, 10 Drawing Sheets

(56) References Cited

U.S. PATENT DOCUMENTS

| | | | |
|---|---|---|---|
| 9,483,404 B2 | 11/2016 | Atkisson | |
| 10,115,444 B1* | 10/2018 | Shin | G11C 13/0069 |
| 2011/0161600 A1* | 6/2011 | Hirano | G06F 9/30043 |
| | | | 711/141 |
| 2011/0173400 A1 | 7/2011 | Isono | |
| 2011/0197013 A1* | 8/2011 | Hirano | G06F 12/0851 |
| | | | 711/3 |
| 2015/0026407 A1* | 1/2015 | McLellan | G06F 12/0864 |
| | | | 711/128 |

* cited by examiner

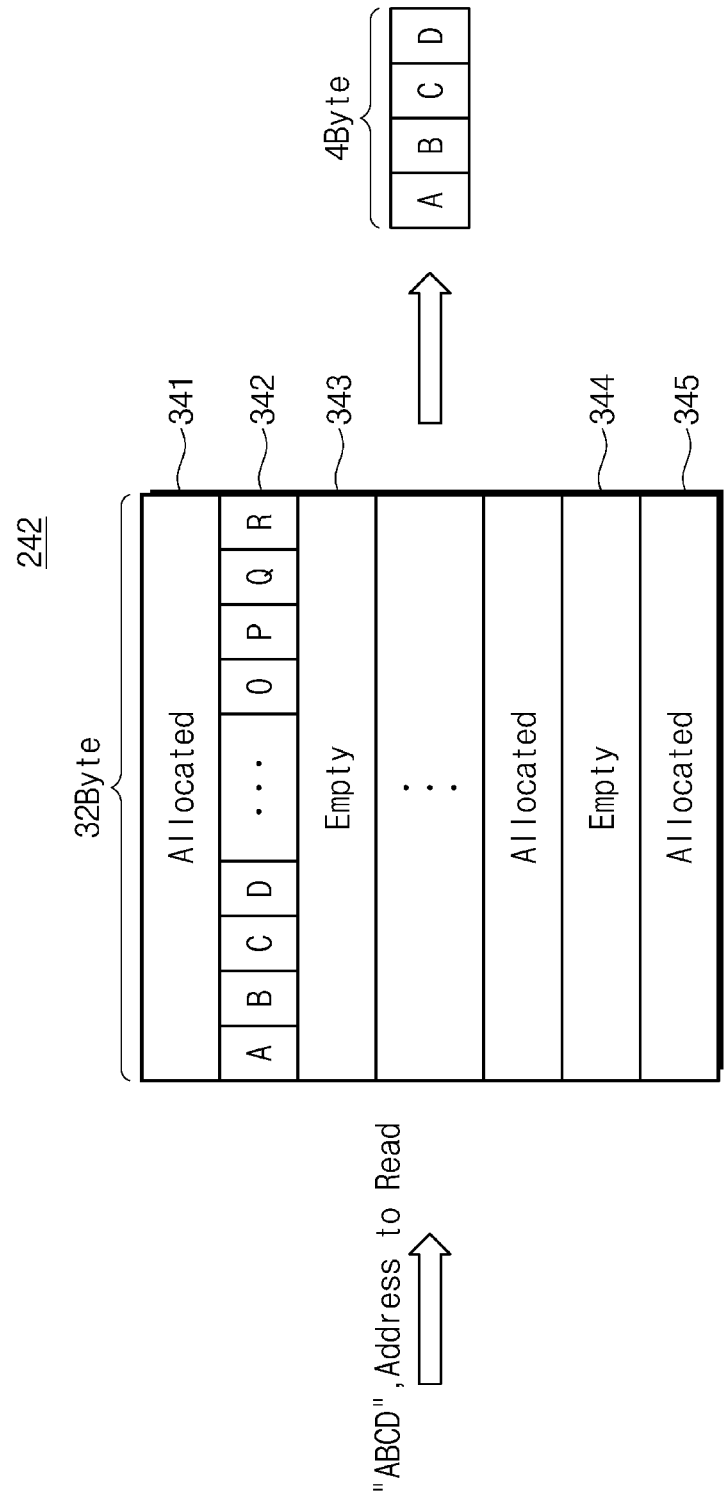

DEVICE AND METHOD FOR ACCESSING IN-BAND MEMORY USING DATA PROTECTION

CROSS-REFERENCE TO RELATED APPLICATIONS

This application claims priority under 35 U.S.C. § 119 to Korean Patent Application No. 10-2017-0142670 filed Oct. 30, 2017, in the Korean Intellectual Property Office, the disclosure of which is incorporated by reference herein in its entirety.

BACKGROUND

Embodiments of the disclosure described herein relate to a computing device and a method for accessing a memory, and more particularly, to a computing device and a method for accessing an in-band memory used for data protection.

A computing device may access a memory for data processing. The computing device may use parity information for the purpose of detecting an error occurring in data upon writing the data to the memory or reading the data from the memory. For example, the computing device may check a data error occurring upon writing or reading data by using 2-byte parity information for each 32-byte data and may directly correct erroneous data if necessary.

An increase in a bandwidth that occurs when the computing device accesses the memory may cause an increase in power consumption of the computing device. Accordingly, there is a need to use the bandwidth efficiently when the computing device accesses the memory.

SUMMARY

Embodiments of the disclosure provide a device and a method for utilizing a memory bandwidth maximally by using a cache memory when a processor accesses an in-band memory used for data protection.

The technical problem to be solved by embodiments of the disclosure is not limited to the above-described technical problems, and other technical problems can be deduced from the following embodiments.

According to an exemplary embodiment, a computing device may include a main memory, a cache memory, and a processor. The main memory stores data and a parity, for checking an error of the data, and sends and receives the data and the parity with a reference size. The processor accesses the main memory. The cache memory caches the data. If the processor requests a write operation for current data, the current data may be stored to the first cache memory and the first cache memory may change the stored current data to the reference size and may output the current data changed to the reference size to the main memory. A size of the current data may be smaller than the reference size.

According to an exemplary embodiment, a processor may include a cache memory. The cache memory may include at least one of a first cache memory for caching data and a second cache memory for caching a parity for checking an error of the data. The first cache memory may output data of a reference size to a main memory, and the second cache memory may output a parity of the reference size to the main memory. The reference size may be determined to be the same as a size for sending and receiving the data and the parity at the main memory.

According to an exemplary embodiment, a method which is performed by a computing device for writing current data may include determining whether data, of a region on the main memory indicated by a first address where writing of the current data is to be performed, are cached to a first cache memory. If the data of the region on the main memory indicated by the first address are cached to the first cache memory, the method includes storing the current data to the first cache memory and changing the current data to a reference size and outputting the current data changed to the reference size from the first cache memory to the main memory. A size of the current data may be smaller than the reference size, and the reference size may be determined to be the same as a size for sending and receiving data and a parity at the main memory.

According to an exemplary embodiment, a computing device includes a main memory that stores information, a cache memory that caches the information, and a processor. The processor communicates data between the processor and the cache memory in a first communication unit of a first size and communicates the data between the cache memory and the main memory in a second communication unit of a second size, which is greater than the first size.

BRIEF DESCRIPTION OF THE FIGURES

The above and other objects and features of the disclosure will become apparent by describing in detail exemplary embodiments thereof with reference to the accompanying drawings.

FIG. 3D illustrates the cache memory that outputs requested read data, according to an embodiment.

DETAILED DESCRIPTION

Below, embodiments of the disclosure will be described in detail and clearly to such an extent that those (hereinafter referred to as "ordinary those") skilled in the art easily implement the disclosure.

Figure 1:
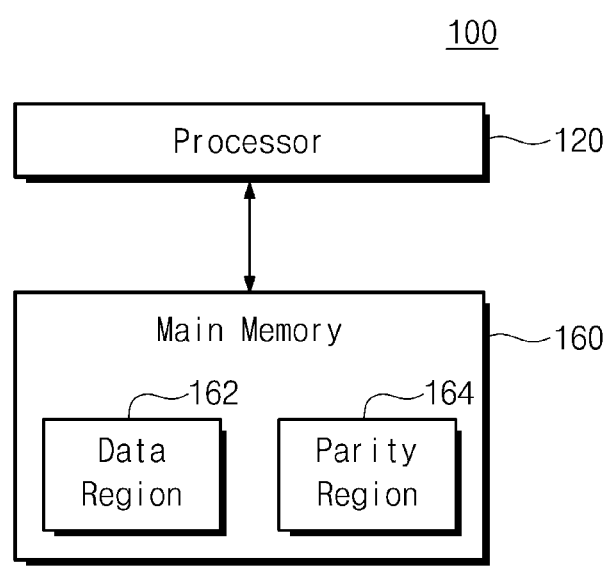
FIG. 1 illustrates a block diagram of a computing device according to an embodiment.

FIG. 1 illustrates a block diagram of a computing device according to an embodiment.

A computing device 100 may include a processor 120 and a main memory 160. The computing device 100 according to an embodiment may be a computer or a mobile device.

The computing device 100 may store or record data to the main memory 160 or may read data from the main memory 160.

The computing device 100 may use parity information for checking an error of data. The computing device 100 according to an embodiment may generate parity information of a specific size for each data of a specific size. For example, the computing device 100 may use 2-byte parity information for each 32-byte data. For example, the computing device 100 may use 1-bit parity information for each 1-byte data. Below, for convenience of description, it is assumed that the computing device 100 uses 2-byte parity information for each 32-byte data for data protection.

The processor 120 may access the main memory 160. The processor 120 may control overall operations of the computing device 100 and may perform a logical operation. The processor 120 according to an embodiment may be a system-on-chip (SoC). The processor 120 according to an embodiment may be an application specific integrated circuit (ASIC), an embedded processor, a microprocessor, hardware control logic, a hardware finite state machine (FSM), a digital signal processor (DSP), or a combination thereof.

The main memory 160 may store data and parity information. The main memory 160 may be used as a working memory of the computing device 100. The main memory 160 may include a volatile memory such as a dynamic random access memory (DRAM), or a nonvolatile memory such as a magnetic RAM (MRAM), a phase-change RAM (PRAM), a resistive RAM (RRAM), a ferroelectric RAM (FRAM), or the like. However, the disclosure may not be limited thereto. For example, the main memory 160 may include any type of memory device for storing data.

The main memory 160 may store data and a parity for checking an error of the data. The main memory 160 may include a data region 162 where data are stored and a parity region 164 where a parity is stored. The main memory 160 according to an embodiment may use the same memory bus for the purpose of sending and receiving data and a parity. For example, the main memory 160 may send and receive data and a parity to and from the outside through one channel.

The main memory 160 may use a specific format upon sending and receiving data and a parity to and from the outside. For example, a basic size unit of data and a parity that are input to the main memory 160 or are output from the main memory 160 may correspond to the size of 32 bytes or 64 bytes. Below, a reference size may mean a basic size unit used for the main memory 160 to send and receive data and a parity. Like the main memory 160, a memory that stores data and a parity to the same memory and sends and receives data and a parity by using the same memory bus may be referred to as an "in-band memory".

Below, for convenience of description, it is assumed that the main memory 160 sends and receives data and a parity to and from the outside on the basis of a reference size of 32 bytes. For example, the main memory 160 may have a memory bandwidth of 32 bytes.

Below, "current data" that are data that the processor 120 currently writes or reads may mean data (e.g., 4 bytes), the size of which is smaller than 32 bytes being a reference size used in the main memory 160.

The computing device 100 may generate a parity for checking an error of data. The main memory 160 may receive data and a parity and may check whether an error is present in the received data based on the received parity. The computing device 100 may read data and a parity from the main memory 160 and may check whether an error is present in the read data based on the parity. An operation of generating a parity for data to be written to the main memory 160 or checking an error of data read from the main memory 160 based on a parity may be performed in an error-correction coding (ECC) engine (not illustrated).

The processor 120 according to an embodiment may send 32-byte data to be written to the main memory 160 to the main memory 160. The computing device 100 according to an embodiment may generate a 2-byte parity for 32-byte data and may send the 2-byte parity to the main memory 160. The main memory 160 may check whether an error is present in the received data based on the received data and the received parity.

The processor 120 according to an embodiment may send current data of a 4-byte size to be written to the main memory 160 to the main memory 160. On the basis of address information on the main memory 160, which is necessary for performing a write request, the computing device 100 according to an embodiment may read 32-byte data stored at the corresponding address and a 2-byte parity corresponding to the 32-byte data by using a 32-byte bandwidth, respectively. The processor 120 may correct the 32-byte data read from the main memory 160 based on current data. The computing device 100 may generate a 2-byte parity for the corrected 32-byte data and may correct the read 2-byte parity based on the generated 2-byte parity. The computing device 100 may write the corrected 32-byte data and the corrected 2-byte parity to the main memory 160 by using the 32-byte bandwidth, respectively. To write 4-byte data, the computing device 100 according to an embodiment may use the 32-byte bandwidth four times because of reading the 32-byte data, reading the 2-byte parity, writing the corrected 32-byte data, and writing the generated 2-byte parity.

Figure 2:
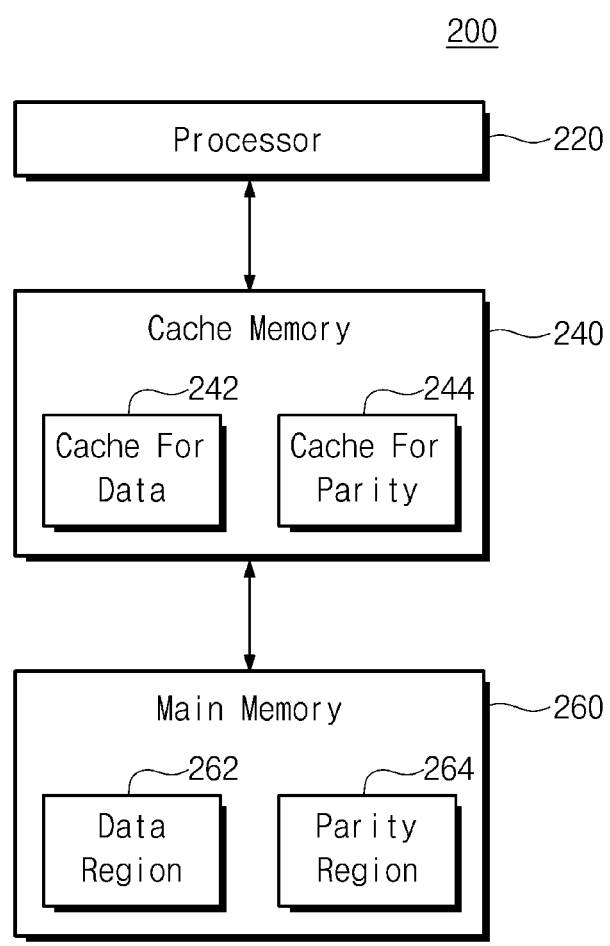
FIG. 2 illustrates a block diagram of the computing device according to an embodiment.

FIG. 2 illustrates a block diagram of a computing device according to an embodiment.

Below, an embodiment in which a processor 220 uses a bandwidth efficiently by using a cache memory upon performing a write or read operation on current data is disclosed.

A computing device 200 of FIG. 2 illustrates a detailed embodiment of the computing device 100 of FIG. 1. Even though omitted below, the above description given with regard to the computing device 100 of FIG. 1 may be applied to the computing device 200 of FIG. 2. The processor 220 and a main memory 260 of FIG. 2 may correspond to the processor 120 and the main memory 160 of FIG. 1, respectively.

The computing device 200 may include the processor 220, a cache memory 240, and the main memory 260.

The cache memory 240 may cache data or a parity. The cache memory 240 according to an embodiment may include at least one of a data cache memory 242 for caching data and a parity cache memory 244 for caching a parity. The data cache memory 242 according to an embodiment may cache data stored to a data region 262 on the main memory 260. The parity cache memory 244 according to an embodiment may cache a parity stored to a parity region 264 on the main memory 260.

The cache memory 240 may store data or a parity received from the processor 220. According to an embodiment, caching may mean an operation of copying and moving data and a parity on the main memory 260 to the cache memory 240, and storing may mean an operation of writing current data received from the processor 220 to a cached space of the cache memory 240.

Each of the data cache memory 242 and the parity cache memory 244 may include tag information and a plurality of cache lines. The tag information may indicate information about a region of the main memory 260 where data are cached. For example, the tag information may indicate whether data of any region on the main memory 260 are cached to the cache memory 240. Each of the plurality of cache lines is a space for caching or storing data or a parity. Each of the data cache memory 242 and the parity cache memory 244 according to an embodiment may cache data or a parity from the main memory 260 in units of a cache line.

Each of the data cache memory 242 and the parity cache memory 244 according to an embodiment may cache data of a partial region of the main memory 260 in units of 32 bytes (e.g., in the case where a size of a cache line is 32 bytes). Each of the data cache memory 242 and the parity cache memory 244 according to an embodiment may be a non-volatile memory. For example, each of the data cache memory 242 and the parity cache memory 244 may include an MRAM or a static RAM (SRAM).

Each of the data cache memory 242 and the parity cache memory 244 according to an embodiment may output data or a parity to the main memory 260 with a reference size that the main memory 260 uses. For example, in the case of a write operation, the data cache memory 242 may store current data received from the processor 220 and may output the stored current data to the main memory 260 after being changed to have the reference size. The current data changed to the reference size may include any other data stored to the data cache memory 242.

The cache memory 240 is illustrated in FIG. 2 as being separated from the processor 220. However, the cache memory 240 may be included in the processor 220. For example, the cache memory 240 may be a level 1 (L1) cache memory or a level 2 (L2) cache memory.

First, according to an embodiment, an operation in which the processor 220 writes current data of 4 bytes in the main memory 260 by using the cache memory 240 will be described.

The processor 220 may request a write operation for the current data from the main memory 260. The processor 220 according to an embodiment may access the cache memory 240 before accessing the main memory 260 for the purpose of writing the current data to the main memory 260.

The current data may be stored to a space of the data cache memory 242 where data of a region on the main memory 260 indicated by an address where the writing of the current data will be performed are cached. The computing device 200 according to an embodiment may determine whether a region of which the data on the main memory 260 indicated by an address where the writing of the current data will be performed are cached to the data cache memory 242. For example, the computing device 200 according to an embodiment may determine whether data of a region on the main memory 260 indicated by an address where the writing of the current data will be performed are cached to the data cache memory 242.

The case where data of a region indicated by an address where the writing of the current data or a current parity will be performed are cached to the data cache memory 242 or the parity cache memory 244 may be determined as the case where a hit occurs. If the hit occurs, the current data are stored to the data cache memory 242. The current data stored to the data cache memory 242 may be output to the main memory 260 with the size of 32 bytes together with any other data later. According to an embodiment, the process of storing and outputting the current data to the data cache memory 242 will be described with reference to FIGS. 3A to 3C.

If data of the region indicated by an address where the writing of the current data will be performed are absent from the data cache memory 242, the current data may be stored to the main memory 260. However, according to an embodiment, data placed at the corresponding address (i.e., an address where writing will be performed) on the main memory 260 may be newly cached to an empty cache line of the data cache memory 242. For example, data of a region on the main memory 260 indicated by an address where the writing of the current data will be performed may be cached to the data cache memory 242 in units of a cache line.

The case where data or a parity of a region indicated by an address where the writing of current data or a current parity will be performed is not cached to the data cache memory 242 or the parity cache memory 244 may be determined as the case where a miss occurs. For example, the miss may occur in the case where the data cache memory 242 or the parity cache memory 244 is initialized or in the case where data or a parity of a region of the main memory 260 indicated by an address where writing will be performed is not cached.

According to an embodiment, an operation in which the processor 220 performs a read operation of current data of 4 bytes with respect to the main memory 260 by using the cache memory 240 will be described.

The processor 220 may request a read operation for current data from the main memory 260.

Even in the case of the read operation, the processor 220 may access the cache memory 240 before accessing the main memory 260. If the read-requested current data are present in the data cache memory 242, the computing device 200 may read the read-requested current data from the data cache memory 242. Since the read-requested current data are output from the cache memory 240, not the main memory 260, the computing device 200 does not need to read parity information. A bandwidth that is necessary for a read operation when the hit occurs in the data cache memory 242 corresponds to 4 bytes.

If the read-requested current data are absent from the cache memory 240, the processor 220 may access the main memory 260 for the purpose of reading data. To read parity information of data to be read, the processor 220 may access the parity cache memory 244 before accessing the main memory 260. If the requested parity is present in the parity cache memory 244, there is no need to read the parity information from the main memory 260. That is, if a hit occurs in the parity cache memory 244 even in the case where a miss occurs in the data cache memory 242, the reading of 32-byte data and the reading of a 2-byte parity are performed. For this reason, a bandwidth that is necessary for a read operation associated with current data of 4 bytes corresponds to 34 bytes.

Figure 3A:
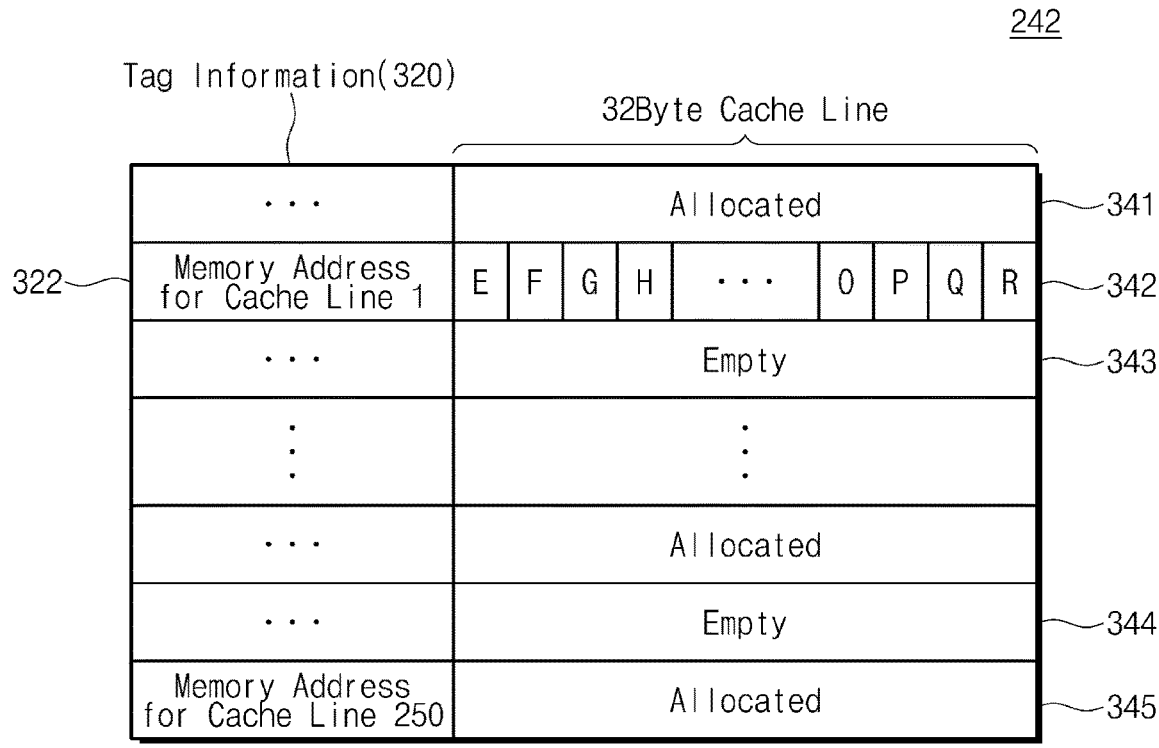
FIG. 3A illustrates a cache memory before receiving current data, according to an embodiment.

FIG. 3A illustrates a cache memory before receiving current data, according to an embodiment.

The data cache memory 242 of FIG. 3A illustrates a state before current data are received. The data cache memory 242 according to an embodiment may be 8K bytes in size. The data cache memory 242 according to an embodiment may include tag information 320 indicating whether data of any region of the main memory 260 are cached and a plurality of cache lines (e.g., a cache line #0 341 to a cache line #250 345) that correspond to a space for caching or storing data. Each of the plurality of cache lines may have a size of 32 bytes. That is, each cache line may have the same size as a reference size used to send and receive data or a parity to and from the outside at the main memory 260. The tag information 320 may be managed to correspond to each cache line. For example, the tag information 322 refers to information indicating whether a cache line #1 342 caches data of any region of the main memory 260.

Each cache line of the data cache memory 242 according to an embodiment may cache data of one region of the main memory 260. In FIG. 3A, a cache line (e.g., the cache line #0 341) marked by "Allocated" refers to a cache line where cached data exist, and a cache line (e.g., the cache line #2 343 and a cache line #249 344) marked by "Empty" refers to an empty cache line.

The cache line #1 342 may be a space where data of a region 322 of the main memory 260 indicated by the tag information 320 of the main memory 260 is together cached. Data of "EFGH . . . OPQR" may be cached to the cache line #1 342. The region of the main memory 260 that the cache line #1 342 caches is assumed as a space including a region on the main memory 260 indicated by an address where a write operation of current data will be performed.

Figure 3B:
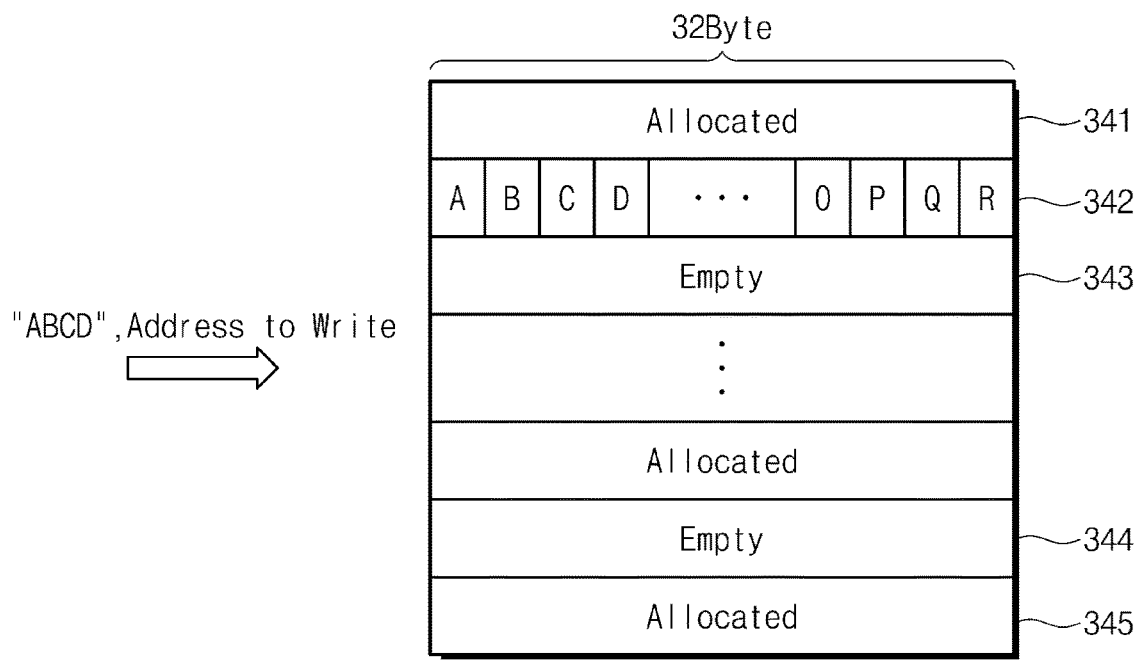
FIG. 3B illustrates the cache memory after received current data are stored, according to an embodiment.

FIG. 3B illustrates a cache memory of a state where current data are stored, according to an embodiment. The data cache memory 242 of FIG. 3A may indicate a state immediately after the data cache memory 242 of FIG. 3A stores received current data.

The processor 220 may send information of an address where current data will be stored to the data cache memory 242 together with 4-byte current data "ABCD" to be written. The current data "ABCD" may be stored to a space where data of a region on the main memory 260 indicated by the address where the current data will be written are cached.

The data cache memory 242 may determine whether data of a region on the main memory 260 indicated by the address where the writing will be performed are cached, by using the tag information 320. According to an embodiment, that data corresponding to an address on the main memory 260 where writing will be performed are present in the cache line #1 342 of the data cache memory 242 may be determined. That is, since data of a region of the main memory 260 indicated by the address where writing will be performed is cached to the cache line #1 342, it may be determined that a hit occurs.

The current data "ABCD" may be stored to the cache line #1 342. According to an embodiment, existing data "EFGH", which are stored at a location corresponding to the address where writing will be performed, from among 32-byte data stored to the cache line #1 342 may be replaced with "ABCD". The 4-byte current data "ABCD" to be written may be temporarily stored to the data cache memory 242 before being sent to the main memory 260.

Figure 3C:
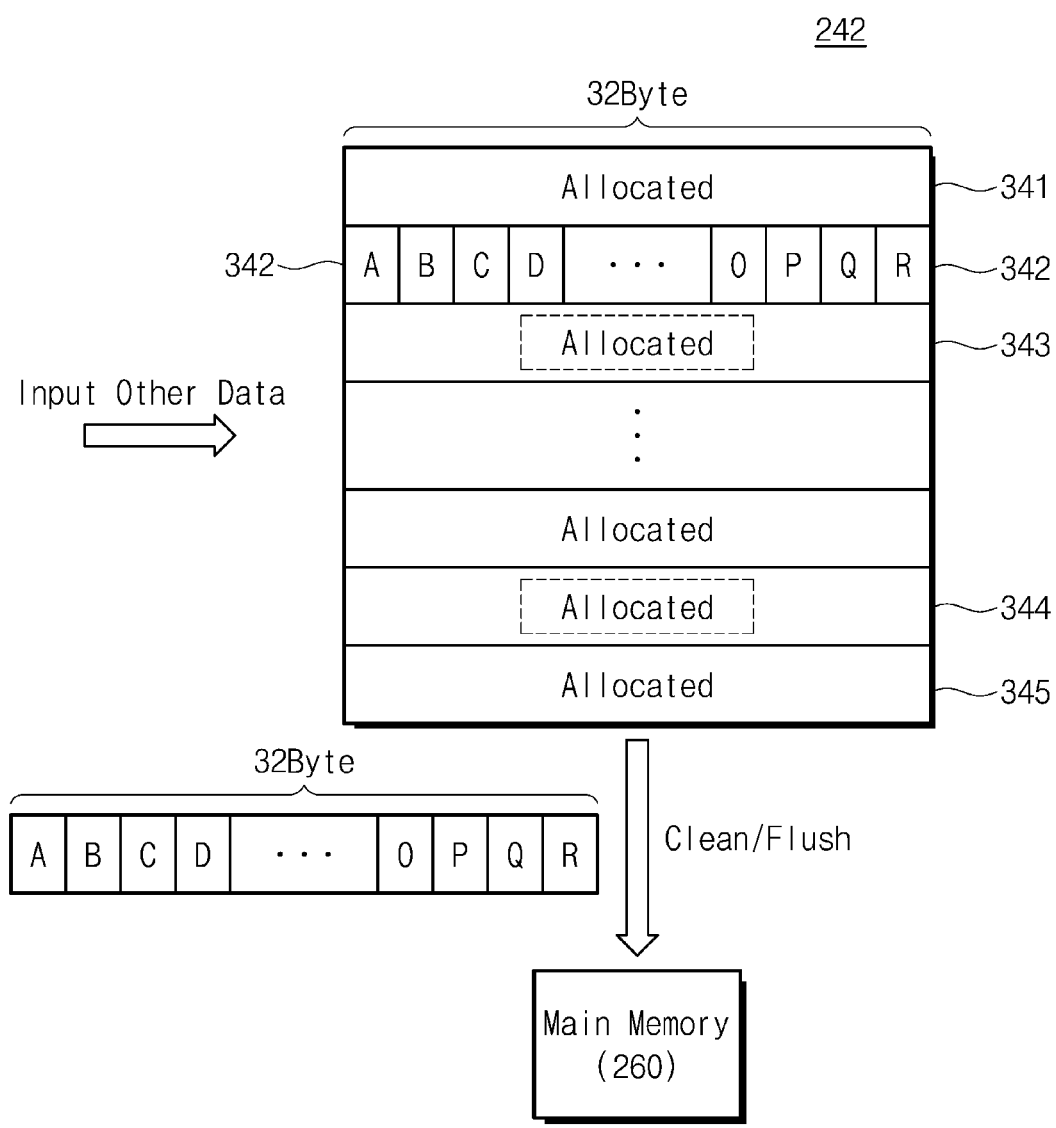
FIG. 3C illustrates the cache memory from which data of a reference size including current data are output, according to an embodiment.

FIG. 3C illustrates a cache memory from which data of a reference size including current data are output, according to an embodiment.

The current data "ABCD" stored to the data cache memory 242 may be changed to data of the reference size (e.g., 32 bytes) used in the main memory 260. The current data changed to the reference size may include the current data "ABCD" and other data (e.g., "OPQR") stored to the data cache memory 242. The current data changed to the reference size may be sent to the main memory 260. That is, the 4-byte current data "ABCD" may be output from the data cache memory 242 with the size of 32 bytes together with the other data. According to an embodiment, the other data may be data that are stored to the data cache memory 242 before the current data are stored to the data cache memory 242 or that are input and stored to the data cache memory 242 after the current data are stored to the data cache memory 242.

The data cache memory 242 according to an embodiment may output data of a cache line to the main memory 260 when a storage space no longer exists. For example, after current data are input to the data cache memory 242, if pieces of other data are input or pieces of data from the main memory 260 are cached, states of a cache line #2 343 and a cache line #249 344 are changed from "Empty" to "Allocated".

The data cache memory 242 according to an embodiment may output data of the cache line #1 342 to the main memory 260 when a clean or flush operation is performed. The data of the cache line #1 342 output from the data cache memory 242 may be stored to the data region 262 of the main memory 260. That is, current data may be temporarily stored to the cache memory 240 and may be output with the size of 32 bytes together with the other data afterward. Since the output 32-byte data are sent to the main memory 260 by using the whole 32-byte bandwidth of a memory bus, it may be efficient in terms of the bandwidth.

According to an embodiment, if data of the cache line #1 342 are output from the data cache memory 242, a 2-byte parity for the output 32-byte data may be generated. The 2-byte parity thus generated may also be first sent to the parity cache memory 244 before being sent to the main memory 260.

A way to write a parity to the main memory 260 by using the parity cache memory 244 is the same as the above-described way to write data to the main memory 260 by using the data cache memory 242, and thus, a detailed description thereof will not be repeated here. The size of the parity cache memory 244 according to an embodiment may be 8K bytes. The parity cache memory 244 may include a plurality of cache lines for storing parity information, and the size of each cache line may be 32 bytes. That is, the parity cache memory 244 may change a current parity to the same size as the reference size (e.g., 32 bytes) used in the main memory 260 before outputting the current parity.

An embodiment is described with reference to FIG. 3C as data of the reference size are output when the data cache memory 242 performs the flush operation. However, current data included in the cache line #1 342 may not be output only when the data cache memory 242 is full. For example, if a hit occurs in the cache line #1 342 and the cache line #1 342 is fully filled with current data input to the cache line #1 342, data of the cache line #1 342 may be output to the main memory 260 even though an empty space is present in the data cache memory 242. Alternatively, if a hit occurs in the cache line #1 342 and the cache line #1 342 is fully filled with other data input to the cache line #1 342 in a next iteration after the current data are input, data of the cache line #1 342 may be output to the main memory 260 even though an empty space is present in the data cache memory 242.

Also, according to an embodiment, current data may be stored to the data cache memory 242, and simultaneously, the data cache memory 242 may change only a format of the current data and may output the current data of the changed format to the main memory 260. Also, a storage space of the data cache memory 242 may be different from a storage space of the parity cache memory 244, and the number of cache lines and the size of each cache line may be variously designed.

FIG. 3D illustrates a cache memory that outputs requested read data, according to an embodiment.

The data cache memory 242 according to an embodiment may receive 4-byte read data "ABCD" from the processor 220. If the read data "ABCD" are present in the data cache memory 242, the 4-byte data "ABCD" may be output from the cache memory 240. For example, if data of a region on the main memory 260 indicated by an address where reading of data will be performed are cached to the cache line #1 342 of the data cache memory 242, the requested read data may be output from the cache line 342.

Figure 4:
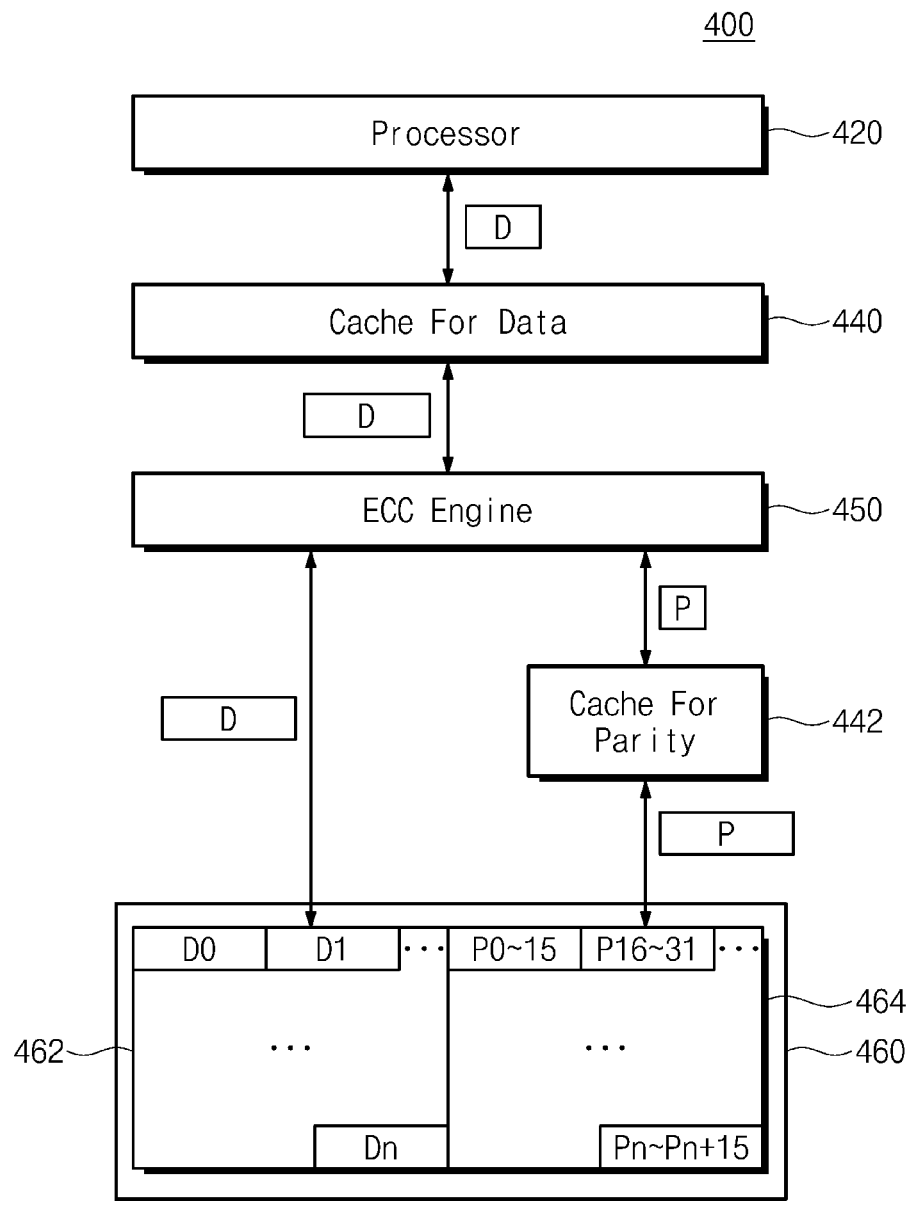
FIG. 4 illustrates an example of the computing device according to an embodiment.

FIG. 4 illustrates an example of a computing device according to an embodiment.

A computing device 400 of FIG. 4 illustrates a detailed embodiment of the computing device 200 of FIG. 2. Even though omitted below, the above description given with regard to the computing device 200 of FIG. 2 may be applied to the computing device 400 of FIG. 4. A processor 420 and a main memory 460 of FIG. 4 may correspond to the processor 220 and the main memory 260 of FIG. 2, respectively. A data cache memory 440 and a parity cache memory 442 of FIG. 4 may correspond to the data cache memory 242 and the parity cache memory 244 of FIG. 2, respectively. The data cache memory 440 and the parity cache memory 442 are illustrated in FIG. 4 as being separated from each other, but the data cache memory 440 and the parity cache memory 442 may be placed on the same cache layer.

The main memory 460 according to an embodiment may include a region 462 for storing data and a region 464 for storing a parity. Pieces of data D0 to Dn may be stored to the region 462 for storing data. Each of D0 to Dn may mean 32-byte data. A parity P0 to P15 to a parity Pn to Pn+15 may be stored to the region 464 for storing a parity. Each of the parity P0 to P15 to the parity Pn to Pn+15 may mean a 32-byte parity, and the 32-byte parity may include 16 parity units, the size of each of which is 2 bytes.

The processor 420 according to an embodiment may communicate with the data cache memory 440 for managing data. For example, the processor 420 may send 4-byte current data to the data cache memory 440 for the purpose of performing a write operation of the current data. Also, the processor 420 may receive current data from the data cache memory 440 for the purpose of performing a read operation of the current data.

The data cache memory 440 according to an embodiment may cache data stored to the data region 462 of the main memory 460 in units of a cache line. Each of a plurality of cache lines of the data cache memory 440 may have the same size as the reference size (e.g., 32 bytes) used in the main memory 460. The data cache memory 440 may include tag information indicating whether data of any region on the main memory 460 are cached and may include tag information for each cache line.

In the case of a write operation, the data cache memory 440 may output 32-byte data including 4-byte current data received from the processor 420 and other data stored to the data cache memory 440 to an ECC engine 450. The other data may mean data stored to the same cache line before or after the received current data are stored. The data cache memory 440 according to an embodiment may send current data included in a cache line to the ECC engine 450 upon performing a clean or flush operation. In the case of a read operation, if requested data are present in the data cache memory 440, the data cache memory 440 may output the requested 4-byte current data to the processor 420.

The ECC engine 450 according to an embodiment may generate a parity or may check an error of data based on a received parity. In the case of the write operation, the ECC engine 450 may generate a 2-byte parity for the 32-byte data (including the 4-byte current data) received from the data cache memory 440. In the case of the read operation, if the read-requested 4-byte current data are present in the data cache memory 440, the requested data may be output from the data cache memory 440, not the main memory 460. For this reason, the ECC engine 450 may not perform an error check operation on the read-requested current data. However, in the case where requested data are output from the main memory 460 (e.g., in the case where a miss occurs in the data cache memory 440), the ECC engine 450 may request parity information for checking an error of read data. In the case where a requested parity is present in the parity cache memory 442, the ECC engine 450 may read the 2-byte parity from the parity cache memory 442. However, in the case where the requested parity is absent from the parity cache memory 442 (e.g., in the case where a miss occurs in the parity cache memory 442), the ECC engine 450 may read the requested parity from the main memory 460 by using the 32-byte bandwidth.

The parity cache memory 442 according to an embodiment may cache parities stored to the parity region 464 of the main memory 460 in units of a cache line. The parity cache memory 442 and the data cache memory 440 may operate in the same manner except that the parity cache memory 442 and the data cache memory 440 manage parities and pieces of data, respectively. For example, in the case of the write operation, the parity cache memory 442 may receive and store a 2-byte parity generated in the ECC engine 450 and output a 32-byte parity including the stored 2-byte parity and any other parity stored to the parity cache memory 442 to the main memory 460. The other parity may mean a parity stored to the same cache line before or after the currently received 2-byte parity is stored. The parity cache memory 442 according to an embodiment may output a cache line of which the parity information including a current parity to the main memory 460 upon performing a clean or flush operation. In the case of the read operation, if a parity requested from the ECC engine 450 is present in the parity cache memory 442, the parity cache memory 442 may output the requested 2-byte parity to the ECC engine 450.

Figure 5:
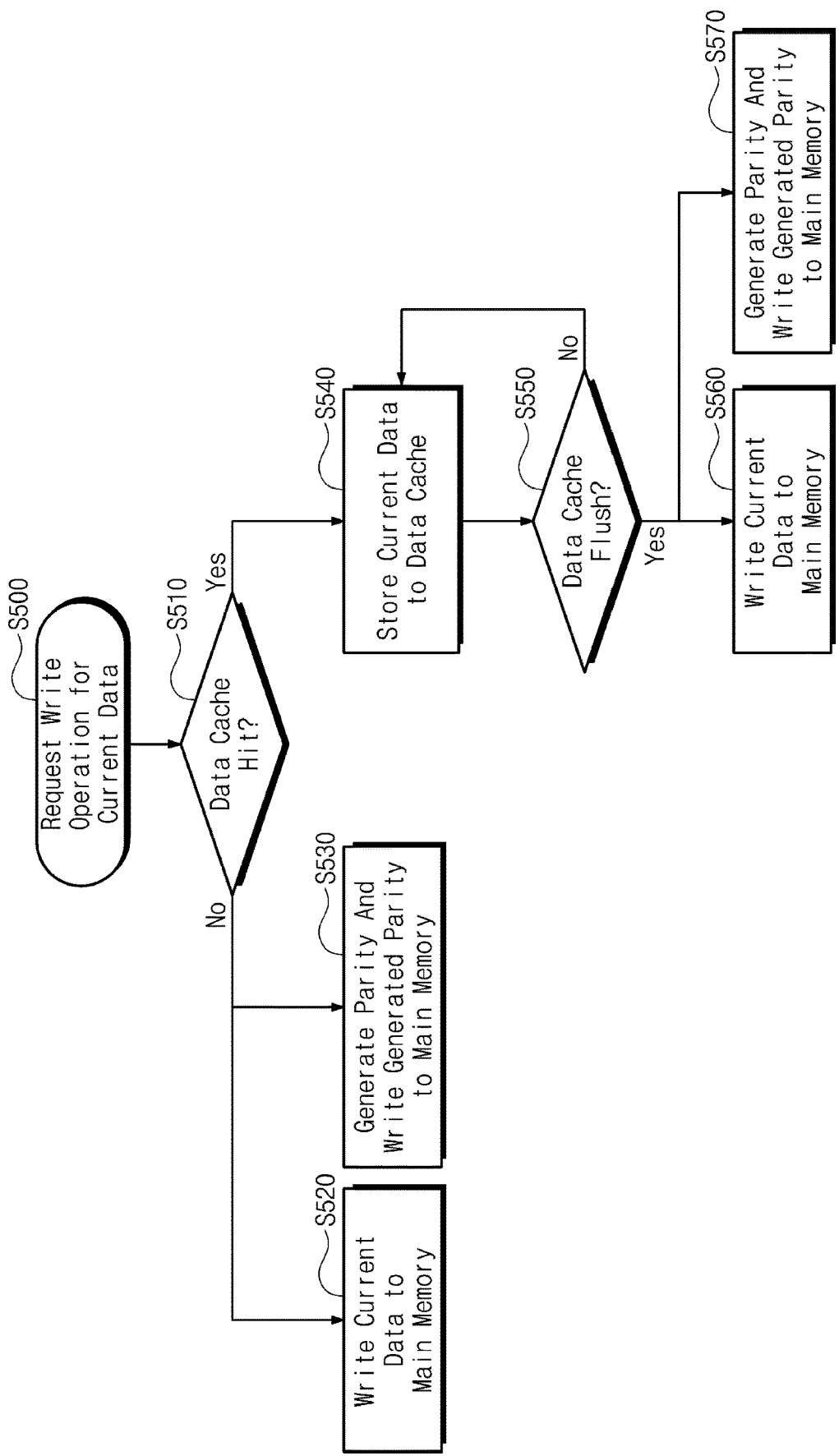
FIG. 5 illustrates a flowchart of a method of performing a write operation on current data at the computing device according to an embodiment.

FIG. 5 illustrates a flowchart of a method of performing a write operation on current data at the computing device according to an embodiment.

In operation S500, a computing device may request a write operation for current data.

In operation S510, the computing device may determine whether data of a main memory indicated by an address where the writing of the current data will be performed is present in a data cache memory (e.g., whether a hit occurs). For example, whether data of a region of the main memory indicated by the address where the writing of the current data will be performed is cached to the data cache memory may be determined with reference to tag information of the data cache memory. The computing device may determine a cache line where the current data will be stored, based on the tag information. If data of the region of the main memory indicated by the address where the writing of the current data will be performed is present in the data cache memory, in operation S540, the current data are stored to the data cache memory. If data of the region of the main memory indicated by the address where the writing of the current data will be performed is absent from the data cache memory, current data may be written to a main memory (S520), and a parity for the current data may be generated, and the generated parity may be written to the main memory (S530).

In operation S520, the computing device may write the current data to the main memory. According to an embodiment, data of the region of the main memory indicated by the address where the writing of the current data will be performed may be newly cached to an empty cache line of the data cache memory.

In operation S530, the computing device may write the generated parity for the current data to the main memory. A way to write the generated parity to the main memory may also be performed by using a parity cache memory to manage a parity. The way to write the generated parity to the main memory using a parity cache memory will be described with reference to FIG. 6.

In operation S540, the computing device may store the current data to the data cache memory. The computing device may determine a cache line, to which the current data will be stored, from among a plurality of cache lines of the data cache memory based on tag information and may store the current data to the determined cache line.

In operation S550, the computing device may determine whether the data cache memory is cleaned or flushed. If it is determined that there is no need to clean or flush the data cache memory, the received current data may not be output to the main memory. If the clean or flush operation is performed on the data cache memory, in operation S560 and operation S570, the current data may be output to the main memory, and a parity may be generated.

In operation S560, the computing device may write data of a cache line including the current data to the main memory. According to an embodiment, pieces of data of cache lines of the data cache memory may be output to the main memory sequentially or in parallel. In operation S560, the current data may be changed to the reference size before being output. Since the size of data of each cache line output to the main memory is the same as the reference size (i.e., 32 bytes) used in the main memory, the bandwidth may be utilized maximally.

In operation S570, the computing device may generate a parity for data of the reference size output from the data cache memory and may write the generated parity to the main memory. A way to write the generated parity to the main memory may also be performed by using the parity cache memory to manage a parity. The way to write the generated parity to the main memory using the parity cache memory will be described with reference to FIG. 6.

Figure 6:
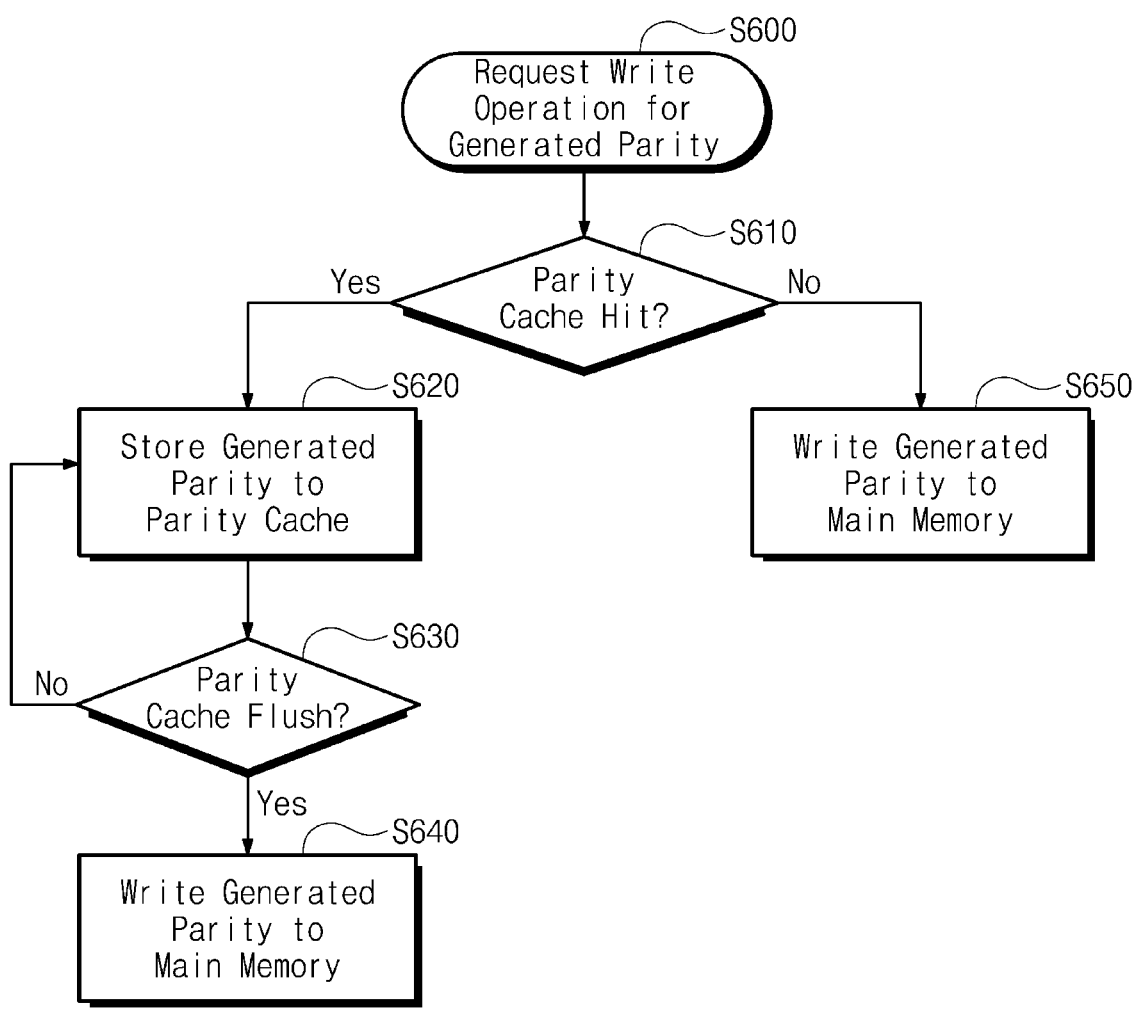
FIG. 6 illustrates a flowchart of a method of performing a write operation on a generated parity at the computing device according to an embodiment.

FIG. 6 illustrates a flowchart of a method of performing a write operation on a generated parity at the computing device according to an embodiment.

Operation S610 to operation S650 is a detailed flowchart according to an embodiment of operation S530 or operation S570 of FIG. 5. However, operation S530 or operation S570 is not limited to the flowchart illustrated in FIG. 6.

In operation S600, a computing device may request a write operation for a generated parity.

In operation S610, the computing device may determine whether a parity of a region of a main memory indicated by an address where the writing of the generated parity will be performed is present in a parity cache memory (e.g., whether a hit occurs). For example, whether the parity of the region of the main memory indicated by the address where the writing of the generated parity will be performed is cached to the parity cache memory may be determined with reference to tag information of the parity cache memory. If the parity of the region of the main memory indicated by the address where the writing of the generated parity will be performed is present in the parity cache memory, in operation S620, the generated parity is stored to the parity cache memory. If the parity of the region of the main memory indicated by the address of the generated parity is absent from the parity cache memory, in operation S650, the generated parity is written to the main memory.

In operation S620, the computing device may store the generated parity to the parity cache memory. The computing device may determine a cache line, to which the generated parity will be stored, from among a plurality of cache lines of the parity cache memory based on tag information and may store the generated parity to the determined cache line.

In operation S630, the computing device may determine whether the parity cache memory is to be cleaned or flushed. If it is determined that there is no need to clean or flush the parity cache memory, the generated parity thus received may not be output to the main memory. When the flush or clean operation is performed on the parity cache memory, the computing device according to an embodiment proceeds to operation S640 to output the generated parity to the main memory.

In operation S640, the computing device may write parity information of a cache line including the current parity to the main memory. According to an embodiment, parities of cache lines of the parity cache memory may be output to the main memory sequentially or in parallel. In operation S640, the generated parity may be changed to the reference size before being output. In this case, since the size of a parity output from each cache line is the same as the reference size (i.e., 32 bytes) used in the main memory, the bandwidth may be utilized maximally.

In operation S650, the computing device may write the generated parity to the main memory. According to an embodiment, a parity of a region of the main memory indicated by an address where the writing of the generated parity will be performed may be newly cached to an empty cache line of the parity cache memory.

Figure 7:
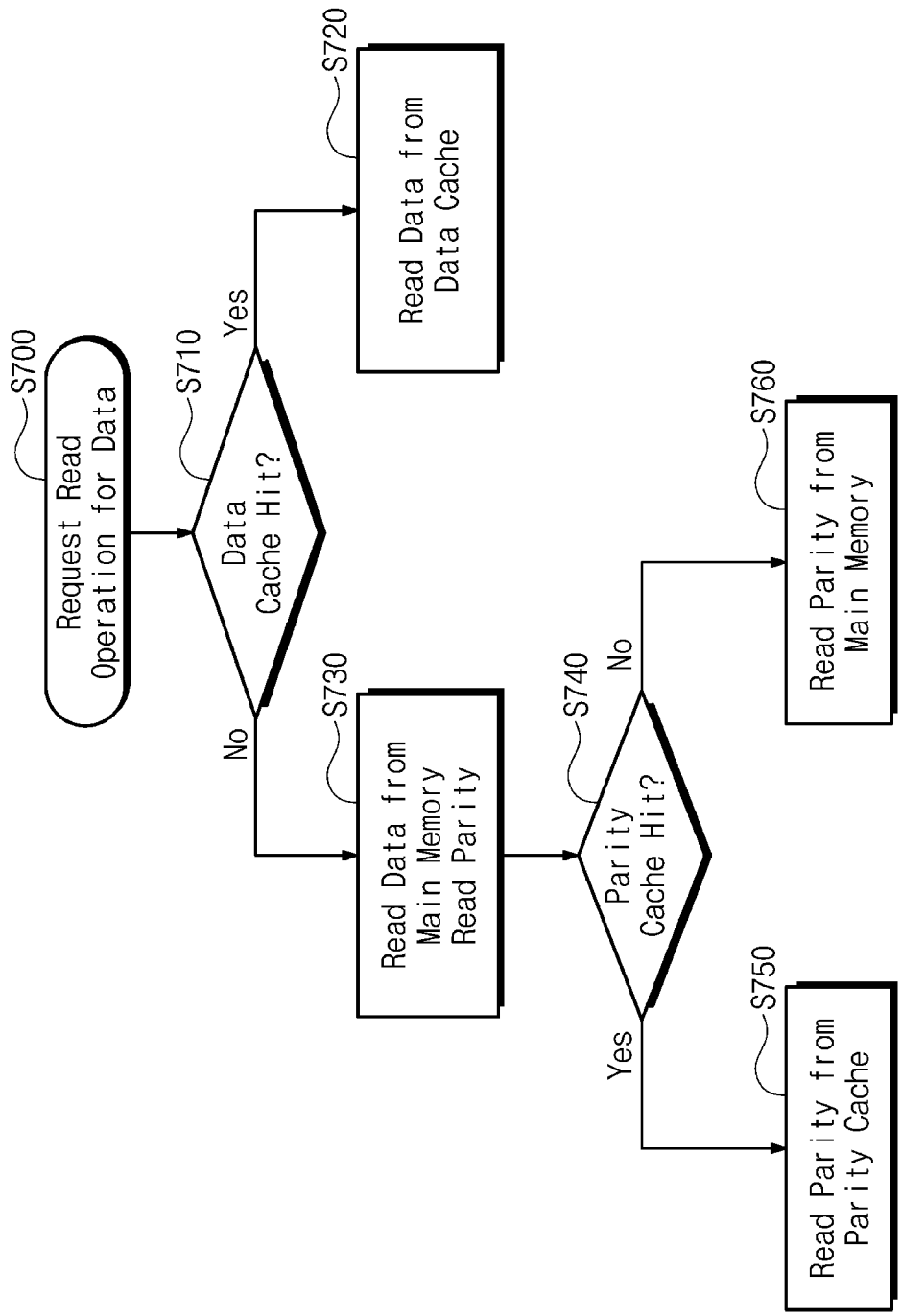
FIG. 7 illustrates a flowchart of a method of performing a read operation at the computing device according to an embodiment.

FIG. 7 illustrates a flowchart of a method of performing a read operation at a computing device according to an embodiment.

In operation S700, a computing device may request a read operation for read data.

In operation S710, the computing device may determine whether the read data are present in a data cache memory (e.g., whether a hit occurs). If the read data are present in the data cache memory, in operation S720, the read data may be output from the data cache memory. The size of the data output from the data cache memory is 4 bytes. Since the read data are output from the data cache memory, not the main memory, there is no need for parity information for checking the read data. If the read data are absent from the data cache memory, in operation S730, the computing device may access the main memory.

In operation S730, the computing device may access the main memory to read the read data. There is a need for a 32-byte bandwidth for the purpose of outputting the requested data from the main memory. Also, the computing device may request a read operation of a parity for checking an error of the read data from the main memory.

In operation S740, the computing device may determine whether the requested parity is present in a parity cache memory (e.g., whether a hit occurs). If the requested parity is present in the parity cache memory, in operation S750, the requested parity may be output from the parity cache memory. The size of the parity output from the parity cache memory is 2 bytes. If the requested parity is absent from the parity cache memory, in operation S760, the computing device may access the main memory.

In operation S760, the computing device may read the requested parity from the main memory. There is a need for a 32-byte bandwidth for the purpose of outputting the requested parity from the main memory.

Figure 8:
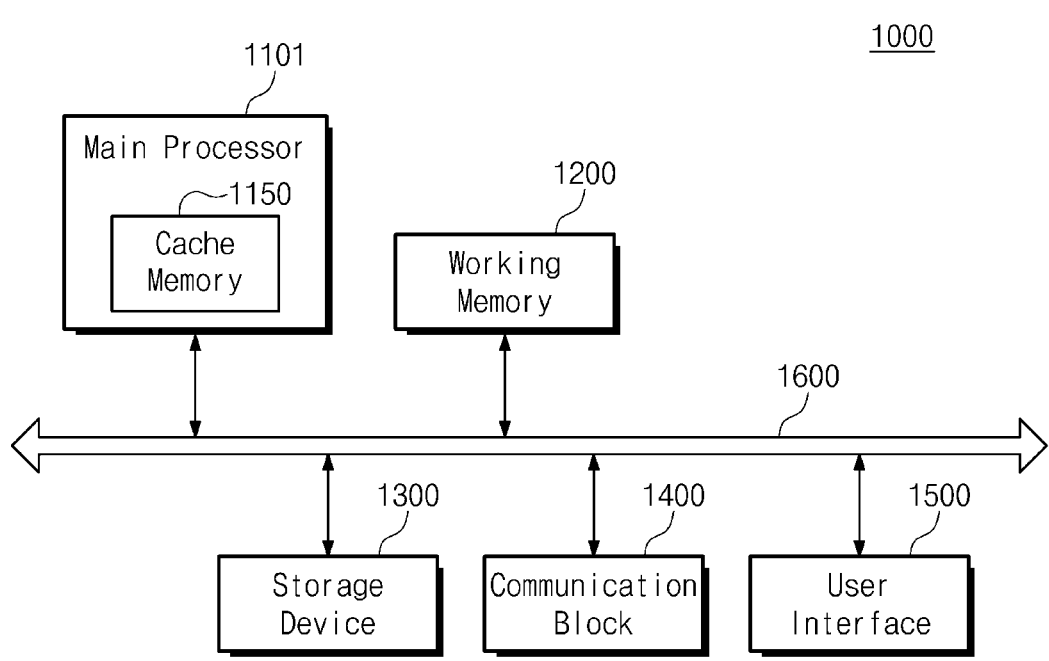
FIG. 8 is a block diagram illustrating an exemplary configuration of an electronic system according to an embodiment.

FIG. 8 is a block diagram illustrating an exemplary configuration of an electronic system including a computing device according to an embodiment.

The electronic system 1000 may include a main processor 1101, a working memory 1200, a storage device 1300, a communication block 1400, a user interface 1500, and a bus 1600. For example, the electronic system 1000 may be one of electronic devices such as a desktop computer, a laptop computer, a tablet computer, a smartphone, a wearable device, a video game console, a workstation, a server, and an electric vehicle. The electronic system 1000 according to an embodiment may include any one of the computing devices described above with reference to FIGS. 2 to 4. For example, the electronic system 1000 may include the computing device 200 of FIG. 2 but is not limited thereto.

The main processor 1101 may control overall operations of the electronic system 1000. The main processor 1101 may process various kinds of arithmetic operations and/or logical operations. To this end, the main processor 1101 may include a special-purpose logic circuit (e.g., a field programmable gate array (FPGA) or application specific integrated chips (ASICs)). For example, the main processor 1101 may include one or more processor cores and may be implemented with a general-purpose processor, a special-purpose processor, or an application processor.

The working memory 1200 may store data to be used in an operation of the electronic system 1000. For example, the working memory 1200 may temporarily store data that are processed or will be processed by the main processor 1101. The working memory 1200 may include a volatile memory, such as a dynamic random access memory (DRAM), a synchronous DRAM (SDRAM), or the like, and/or a nonvolatile memory, such as a phase-change RAM (PRAM), a magneto-resistive RAM (MRAM), a resistive RAM (ReRAM), a ferroelectric RAM (FRAM), or the like.

The working memory 1200 according to an embodiment may be implemented with the main memory 260 of FIG. 2 for data protection. For example, the working memory 1200 may be an in-band memory where data and parity information for checking an error of the data are stored to one memory. The working memory 1200 may send and receive data and a parity to and from the outside with the reference size. For example, the working memory 1200 may send or receive data and a parity to or from the bus 1600 in units of 32 bytes.

The storage device 1300 may include at least one memory device and a controller. The memory device of the storage device 1300 may retain data regardless of power supply. For example, the storage device 1300 may include a nonvolatile memory device such as a flash memory, a PRAM, a MRAM, a ReRAM, or a FRAM. For example, the storage device 1300 may include a storage medium such as a solid state drive (SSD), card storage, or embedded storage.

The communication block 1400 may communicate with an external device/system of the electronic system 1000. For example, the communication block 1400 may support at least one of various wireless communication protocols such as long term evolution (LTE), worldwide interoperability for microwave access (WiMax), global system for mobile communication (GSM), code division multiple access (CDMA), Bluetooth, near field communication (NFC), wireless fidelity (Wi-Fi), radio frequency identification (RFID) and/or at least one of various wired communication protocols such as transfer control protocol/Internet protocol (TCP/IP), universal serial bus (USB), and Firewire.

The user interface 1500 may perform communication mediation between a user and the electronic system 1000. For example, the user interface 1500 may include input interfaces such as a keyboard, a mouse, a keypad, a button, a touch panel, a touch screen, a touch pad, a touch ball, a camera, a microphone, a gyroscope sensor, and a vibration sensor. For example, the user interface 1500 may include output interfaces such as a liquid crystal display (LCD) device, a light emitting diode (LED) display device, an organic LED (OLED) display device, an active matrix OLED (AMOLED) display device, a speaker, and a motor.

The bus 1600 may provide a communication path between the components of the electronic system 1000. The components of the electronic system 1000 may exchange data with each other based on a bus format of the bus 1600. For example, the bus format may include one or more of various interface protocols such as USB, small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), enhanced IDE (EIDE), nonvolatile memory express (NVMe), and universal flash storage (UFS).

The main processor 1101 may write data to the working memory 1200 or may read data from the working memory 1200. As described above with reference to FIGS. 2 to 7, the main processor 1101 may use a cache memory 1150 in write and read operations. The cache memory 1150 according to an embodiment may include a data cache memory that outputs data with a reference size used in the working memory 1200. The cache memory 1150 according to an embodiment may include a parity cache memory that outputs a parity with the reference size used in the working memory 1200. Accordingly, since the main processor 1101 inputs data and a parity by utilizing a memory bandwidth maximally even upon performing a write operation on data, the size of which is smaller than the reference size used in the working memory 1200, a waste of bandwidth may be maximally prevented. The cache memory 1150 is illustrated as being included in the main processor 1101. However, according to an embodiment, the cache memory 1150 may be interposed between the bus 1600 and the working memory 1200.

Meanwhile, the above-described method may be implemented in a computer-readable recording medium as a program or codes which a computer can read out. The computer-readable recording medium may include all kinds of storage devices in which data are stored. Examples of the computer-readable recording medium include read-only memories (ROMs), random-access memories (RAMs), CD-ROMs, magnetic tapes, floppy disks, optical data storage devices, and carrier waves (such as data transmission through the Internet). Also, in the computer-readable recording medium, a program or codes, which a computer can read out, may be stored and executed in a distributed manner.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like.

The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. A computing device comprising:
a main memory that stores data and a parity, for checking an error of the data;
a processor that accesses the main memory;
a first cache memory that stores the data; and
a second cache memory that stores the parity, wherein:
in response to the processor requesting a write operation for current data, the current data are stored to the first cache memory and the first cache memory simultaneously outputs the current data solely with other data to the main memory using a reference size,
a current parity is generated for the current data and stored in the second cache memory,
the second cache memory simultaneously outputs the current parity solely with other parity to the main memory using the reference size, and
the size of the current data is smaller than the reference size.

2. The computing device of claim 1, wherein the current data are stored to a space of the first cache memory corresponding to an address of the main memory where the current data are to be written.

3. The computing device of claim 1, wherein:
the first cache memory includes tag information, indicating a region of the main memory, and a plurality of cache lines for storing cached data, and
a cache line, among the plurality of cache lines, to which the current data are to be stored is determined based on the tag information.

4. The computing device of claim 3, wherein:
a size of each of the plurality of cache lines is the reference size,
first data of the cache line are output to the main memory,
the first data include the current data and the other data,
the other data includes second data stored in the cache line before the current data and third data stored in the cache line after the current data.

5. The computing device of claim 1, wherein the current data and the other data are output, using the reference size, to the main memory in response to performing a clean or flush operation of the first cache memory.

6. The computing device of claim 1, further comprising
in response to determining that a previous parity, corresponding to an address of the main memory where the current parity generated for the current data is to be written, is stored in the second cache memory, the current parity generated for the current data is stored in the second cache memory and the second cache memory simultaneously outputs the current parity generated for the current data with the other parity to the main memory using the reference size.

7. The computing device of claim 1, wherein in response to the processor requesting a read operation for read data, the read data are output from the first cache memory.

8. The computing device of claim 7,
wherein
read parity for checking an error of the read data, among the parity, is output from the second cache memory.

9. A processor comprising:
a cache memory, the cache memory including a first cache memory that stores first data and a second cache memory that stores a first parity for checking an error of the first data, wherein:
the first cache memory simultaneously outputs the first data solely with first other data to a main memory using a reference size,
the second cache memory simultaneously outputs the first parity solely with first other parity to the main memory using the reference size, and
the reference size is a size for sending and receiving each of: (1) the first data with the first other data and (2) the first parity with the first other parity at the main memory.

10. The processor of claim 9, wherein:
in response to a request for a write operation of current data, the first cache memory receives and stores the current data and simultaneously outputs the current data with current other data to the main memory using the reference size, and
the size of the current data is smaller than the reference size.

11. The processor of claim 10, wherein the current data are stored to a space of the first cache memory corresponding to an address of the main memory where the current data are to be written.

12. The processor of claim 10, wherein:
the first cache memory includes tag information, indicating a region of the main memory, and a plurality of cache lines for storing cached data,
the first cache memory determines a cache line, among the plurality of cache lines, in which the current data are to be stored based on the tag information and outputs the first data of the cache line to the main memory, and
a size of each of the plurality of cache lines is the reference size.

13. The processor of claim 10, wherein the second cache memory receives and stores a current parity generated with respect to the current data and simultaneously outputs the current parity with second other parity to the main memory using the reference size.

14. The processor of claim 13, wherein:
the second cache memory includes tag information, indicating a region of the main memory, and a plurality of cache lines for storing cached parity,
the second cache memory determines a cache line, from among the plurality of cache lines, in which the current parity generated with respect to the current data is to be stored based on the tag information and outputs a second parity of the cache line to the main memory using the reference size, and
a size of each of the plurality of cache lines is the reference size.

15. The processor of claim 9, wherein:
the first cache memory simultaneously outputs the first data with the first other data to the main memory when a clean or flush operation is performed, and the second cache memory simultaneously outputs the first parity and the first other parity to the main memory when the clean or flush operation is performed.

16. A method, performed by a computing device, for writing current data to a main memory, the method comprising:
   determining whether previous data, corresponding to an address of the main memory where the current data are to be written, are stored to a first cache memory;
   in response to determining the previous data are stored to the first cache memory, storing the current data to the first cache memory;
   simultaneously outputting the current data solely with other data from the first cache memory to the main memory using a reference size;
   generating a current parity for the current data and storing the current parity in a second cache memory; and
   simultaneously outputting the current parity solely with other parity from the second cache memory to the main memory using the reference size, wherein
   a size of the current data is smaller than the reference size, and the reference size is a size for sending and receiving each of: (1) the current data and the other data and (2) the current parity and the other parity at the main memory.

17. The method of claim 16, wherein simultaneously outputting the current data solely with the other data from the first cache memory to the main memory using the reference size includes:
   determining whether a clean or flush operation of the first cache memory is performed; and
   writing first data of a cache line that stores the current data and the other data to the main memory in response to determining that the clean or flush operation of the first cache memory is performed.

18. The method of claim 16, wherein writing the current parity for the current data to the main memory includes:
   determining whether a previous parity, corresponding to a second address of the main memory where the current parity for the current data is to be written, is stored in a second cache memory;
   in response to determining the previous parity is stored in the second cache memory, storing the current parity for the current data to the second cache memory; and
   simultaneously outputting the current parity with the other parity to the main memory using the reference size.

* * * * *